US009964563B1

(12) United States Patent
Gunasing et al.

(10) Patent No.: US 9,964,563 B1
(45) Date of Patent: May 8, 2018

(54) METHOD AND APPARATUS FOR ICT FIXTURE PROBE CLEANING

(71) Applicant: Flextronics AP, LLC, Broomfield, CO (US)

(72) Inventors: David Durai Pandian Sam Gunasing, Gelugor Penang (MY); Teh Wee Min, Penang (MY)

(73) Assignee: Flextronics AP, LLC, Broomfield, CO (US)

( * ) Notice: Subject to any disclaimer, the term of this patent is extended or adjusted under 35 U.S.C. 154(b) by 345 days.

(21) Appl. No.: 14/802,565

(22) Filed: Jul. 17, 2015

Related U.S. Application Data

(60) Provisional application No. 62/026,416, filed on Jul. 18, 2014.

(51) Int. Cl.
*G01R 31/20* (2006.01)
*G01R 3/00* (2006.01)
*B08B 5/02* (2006.01)

(52) U.S. Cl.
CPC . *G01R 3/00* (2013.01); *B08B 5/02* (2013.01)

(58) Field of Classification Search
CPC .............................. G01R 33/09; G01R 33/093
USPC ........................................ 324/252, 200, 244
See application file for complete search history.

(56) References Cited

U.S. PATENT DOCUMENTS 5,153,385 A 10/1992 Juskey et al.
5,969,262 A 10/1999 Ino et al.
6,078,387 A 6/2000 Sykes
6,178,823 B1 1/2001 Sykes
6,237,422 B1 5/2001 Sykes
6,301,971 B1 10/2001 Sykes
6,341,530 B1 5/2002 Sykes
6,395,568 B1 5/2002 Blish et al.
6,548,881 B1 4/2003 Blish et al.
6,681,640 B2 1/2004 Canumalla
6,812,578 B2 11/2004 Kim et al.
7,013,564 B2 3/2006 Shimokawa et al.
7,319,043 B2 1/2008 Yang et al.
7,444,012 B2 10/2008 White et al.
7,446,546 B2 11/2008 Yang et al.
7,543,507 B2 6/2009 Li et al.
8,096,837 B2 1/2012 Kan et al.
8,100,021 B2 1/2012 Sykes
8,534,136 B2 9/2013 Xie et al.
(Continued)

FOREIGN PATENT DOCUMENTS

JP 07218405 8/1995
JP 10150078 6/1998
(Continued)

OTHER PUBLICATIONS

4000HS High Speed Bondtesting, www.dage-group.com.
Mudasir Ahmad, Jennifer Burlingame, and Cherif Guirguis, Comprehensive Methodology to Characterize and Mitigate BGA Pad Catering in Printed Circuit Boards, SMTA Journal, 2009, pp. 21-28, vol. 22, Issue 1.
(Continued)

*Primary Examiner* — Giovanni Astacio-Oquendo
(74) *Attorney, Agent, or Firm* — Haverstock & Owens LLP

(57) ABSTRACT

A probe cleaning plate is configured to clean the probe plate of an ICT fixture. In particular, the probe cleaning plate is used to support a plurality of probes included as part of the probe plate and enable cleaning of the probe heads of each probe while maintaining support of the probes and minimizing, if not preventing, seepage of cleaning solution and contaminates from to the base of the probes.

16 Claims, 3 Drawing Sheets

(56) References Cited

U.S. PATENT DOCUMENTS

| | | | | |
|---|---|---|---|---|
| 2005/0018898 | A1 | 1/2005 | White et al. | |
| 2007/0152693 | A1 | 7/2007 | Yang et al. | |
| 2008/0078233 | A1* | 4/2008 | Larson | G01N 29/022 73/24.04 |
| 2008/0190212 | A1 | 8/2008 | Sykes | |
| 2008/0239265 | A1* | 10/2008 | Den Boef | G01N 21/956 355/53 |
| 2009/0060790 | A1* | 3/2009 | Okaguchi | G01N 29/022 422/68.1 |
| 2009/0151989 | A1 | 6/2009 | Hunrath | |
| 2013/0027867 | A1* | 1/2013 | Lauder | G06F 1/1613 361/679.29 |
| 2014/0318994 | A1* | 10/2014 | Lee | A45C 11/00 206/37 |
| 2015/0332563 | A1* | 11/2015 | Davis | G08B 5/006 342/66 |

FOREIGN PATENT DOCUMENTS

| | | |
|---|---|---|
| JP | 2003188201 | 7/2003 |
| JP | 2007163147 | 6/2007 |

OTHER PUBLICATIONS

Pull Testing-Cold Bump Bull, www.dage-group.com/pull-testing-coldbump-pull.

Robert Stykes, Pull Testing High Speed Bondtester, www.dage.de/de/bontest/400hs.htm.

Wire Bonding Assembly, Florida MicroElectronics, www.flmicroelec.com.

Die Alternative zum Drop Test High Speed Bondtester, www.dage.de/de/bondtest/4000hs.htm.

* cited by examiner

METHOD AND APPARATUS FOR ICT FIXTURE PROBE CLEANING

RELATED APPLICATIONS

This Patent Application claims priority under 35 U.S.C. 119 (e) of the U.S. Provisional Application, Ser. No. 62/026,416, filed Jul. 18, 2014, and entitled "METHOD FOR ICT FIXTURE PROBE CLEANING". This application incorporates U.S. Provisional Application, Ser. No. 62/026,416 in its entirety by reference.

FIELD OF THE INVENTION

The present invention is generally directed to the field of in-circuit testing (ICT) and ICT fixtures for performing ICT. More specifically, the present invention is directed to a method and apparatus for cleaning ICT fixture probes.

BACKGROUND OF THE INVENTION

In-circuit test (ICT) is a procedure used for testing printed circuit boards (PCBs). Using ICT equipment it is possible to gain access to the circuit nodes on a PCB and measure the performance of the components, checking for shorts, opens, resistance, capacitance, and other basic quantities that indicate whether the assembly was correctly fabricated. ICT equipment typically includes an ICT fixture that interfaces with the PCB and a measuring unit connected to the ICT fixture. In order to carry out the test it is necessary to gain access to each node on the PCB. A common way of achieving this is to generate a "bed of nails" ICT fixture. The term bed of nails is a graphic description of what many fixtures look like, having a large number of test points or probes protruding from a board that holds them in place. Traditional bed of nails ICT fixtures require the manufacture of a complex mechanical device having an array of pin-like probes inserted into holes in an acrylic plate connected to the measuring unit by wires, or wirelessly. By pressing the PCB under test against the array of probes, reliable contact can be quickly and simultaneously made with hundreds or even thousands of individual test points within the circuitry of the PCB. The PCB may either be pulled down under the action of a vacuum or it may be achieved mechanically, thus pulling the PCB downwards onto the array of probes.

Flux residues present on the test points of the PCB results in contamination of the ICT fixture probes. This can result in faulty probe contact with the test point, increased test time and test cycle count, and reduction in over all device under test yield. Accordingly, it is necessary to periodically clean the probes of the ICT fixture. A common cleaning method is to identify contaminated probes on the ICT fixture, spray cleaning solvent on the probe heads and use a cleaning cloth or brush to scrub the probe heads. Each of these steps is typically performed manually. To properly access the probes for cleaning, a top plate of the ICT fixture is removed to expose an upper portion of the probes, as shown in FIG. 1. Without the top plate, the exposed portions of the probe are not structurally supported. Care is required so as to minimize damaging or bending the probes while scrubbing. As such this is a tedious and time consuming process.

SUMMARY OF THE INVENTION

Embodiments are directed to a cleaning device used to clean the probe plate of an ICT fixture. In particular, the cleaning device is used to support a plurality of probes included as part of the probe plate and enable cleaning of the probe heads of each probe while maintaining support of the probes and minimizing, if not preventing, seepage of cleaning solution and contaminates from to the base of the probes.

In an aspect, a cleaning device for cleaning a probe head of each of a plurality of probes included as part of an in-circuit testing fixture is disclosed. The in-circuit testing fixture includes a probe plate wherein a first end of each of the plurality of probes is mounted to the probe plate and a second end of each of the plurality of probes protrudes away from the probe plate. The second end comprises the probe head. The cleaning device comprises a substrate and an air seal gasket. The substrate comprises a first surface, a second surface opposite the first surface, a plurality of first through holes extending from the first surface to the second surface and one or more air input through holes extending from the first surface to the second surface. The plurality of first through holes are aligned such that each first through hole receives a second end of a corresponding one of the plurality of probes and that the probe head of each probe protrudes from the first surface of the substrate. The air seal gasket is coupled to the second surface of the substrate. The air seal gasket forms a perimeter around the plurality of first through holes and the one or more air input through holes exposed at the second surface. The cleaning device is mounted to the probe plate such that the air seal gasket is coupled to the probe plate thereby forming a hollow section between the probe plate and the second surface of the substrate and bounded by the air seal gasket such that air is directed into the hollow section via the one or more air input through holes air is directed out of the hollow section via the plurality of through holes. In some embodiments, the cleaning device also includes one or more air hoses, each air hose coupled to a corresponding one of the air input through holes. In some embodiments, the cleaning device also includes an air compressor coupled to the one or more air hoses. In some embodiments, the cleaning device also includes an air regulator coupled between the air compressor and the one or more air hoses. In some embodiments, the one or more air hoses, the one or more air input through holes, the hollow section and the plurality of first through holes are configured to force air through the plurality of first through holes from the second surface toward the first surface. In some embodiments, the air forced through the plurality of first through holes forces cleaning solvent applied to the probe heads away from the plurality of first through holes. In some embodiments, the cleaning device also includes an dam coupled to the first surface of the substrate, wherein the dam forms a perimeter around the plurality of first through holes exposed at the first surface. In some embodiments, the plurality of first through holes each comprise side walls, wherein the side walls taper from the second surface to the first surface such that a cross-section of each first through hole is larger at the second surface than at the first surface.

In another aspect, another cleaning device is disclosed. The cleaning device includes a probe plate comprising a first substrate and a plurality of probes, a second substrate and an air seal gasket. A first end of each of the plurality of probes is mounted to the first substrate and a second end of each of the plurality of probes protrudes away from the first substrate. The second end of each of the plurality of probes comprises a probe head. The second substrate comprises a first surface, a second surface opposite the first surface, a plurality of first through holes extending from the first surface to the second surface and one or more air input through holes extending from the first surface to the second surface. The plurality of first through holes are aligned such that each first through hole receives a second end of a corresponding one of the plurality of probes and that the probe head of each probe protrudes from the first surface of the second substrate. The air seal gasket is coupled to the second surface of the second substrate. The air seal gasket forms a perimeter around the plurality of first through holes and the one or more air input through holes exposed at the second surface. The air seal gasket is mounted to the probe plate such that the air seal gasket is coupled to the first substrate thereby forming a hollow section between the first substrate and the second surface of the second substrate and bounded by the air seal gasket such that air is directed into the hollow section via the one or more air input through holes air is directed out of the hollow section via the plurality of through holes. In some embodiments, the cleaning device also includes one or more air hoses, each air hose coupled to a corresponding one of the air input through holes. In some embodiments, the cleaning device also includes an air compressor coupled to the one or more air hoses. In some embodiments, the cleaning device also includes an air regulator coupled between the air compressor and the one or more air hoses. In some embodiments, the one or more air hoses, the one or more air input through holes, the hollow section and the plurality of first through holes are configured to force air through the plurality of first through holes from the second surface toward the first surface. In some embodiments, the air forced through the plurality of first through holes forces cleaning solvent applied to the probe heads away from the plurality of first through holes. In some embodiments, the cleaning device also includes an dam coupled to the first surface of the substrate, wherein the dam forms a perimeter around the plurality of first through holes exposed at the first surface. In some embodiments, the plurality of first through holes each comprise side walls, wherein the side walls taper from the second surface to the first surface such that a cross-section of each first through hole is larger at the second surface than at the first surface.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a method and apparatus for ICT fixture probe cleaning. Those of ordinary skill in the art will realize that the following detailed description of the method and apparatus for ICT fixture probe cleaning is illustrative only and is not intended to be in any way limiting. Other embodiments of the method and apparatus for ICT fixture probe cleaning will readily suggest themselves to such skilled persons having the benefit of this disclosure.

Reference will now be made in detail to implementations of the method and apparatus for ICT fixture probe cleaning as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
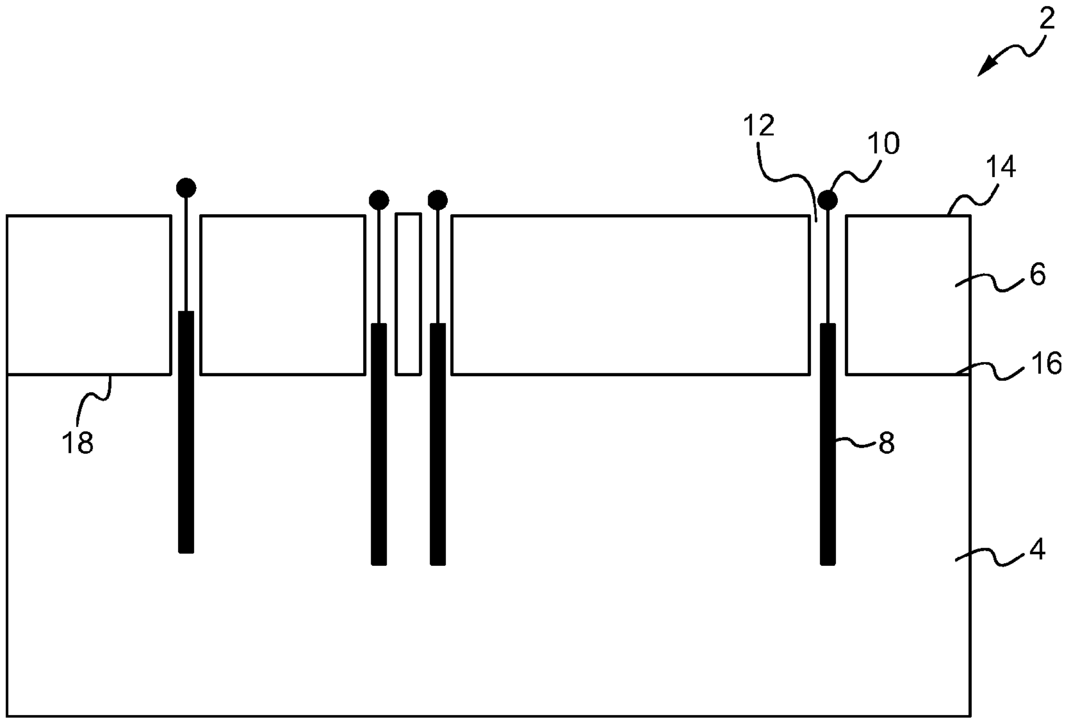
FIG. 1 illustrates a cut out side view of an ICT fixture according to an embodiment.

FIG. 1 illustrates a cut out side view of an ICT fixture according to an embodiment. The ICT fixture 2 includes a probe plate 4 and a top plate 6. A plurality of probes 8 are mounted to the probe plate 4. In this exemplary configuration, a first end of each probe 8 is mounted to the probe plate 4, with a second end of each probe 8 protruding from a surface 18 of the probe plate 4. Each probe 8 includes a probe head 10. In some embodiments, each probe 8 is a spring loaded barrel and plunger type probe, where the barrel is the first end of the probe fixedly mounted to the probe plate 4, a spring is positioned in the barrel and a first end of a plunger is positioned within the barrel so as to move against the spring. A second end of the plunger functions as the probe head. The barrel of the probe can be positioned within a socket in the probe plate. It is understood that alternative types of probes can be used. The exemplary probe plate 4 shown in FIG. 1 includes four probes 8. It is understood that more or less than four probes can be mounted to the probe plate 4. Although not shown in FIG. 1, the probe plate 4 can include electronics coupled to the probes 8. In general, the probes 8 are coupled, either wired or wirelessly, to an in-circuit tester that may include, but is not limited to, drivers and sensors that are used to set up and perform the measurements made by the ICT fixture.

Figure 2:
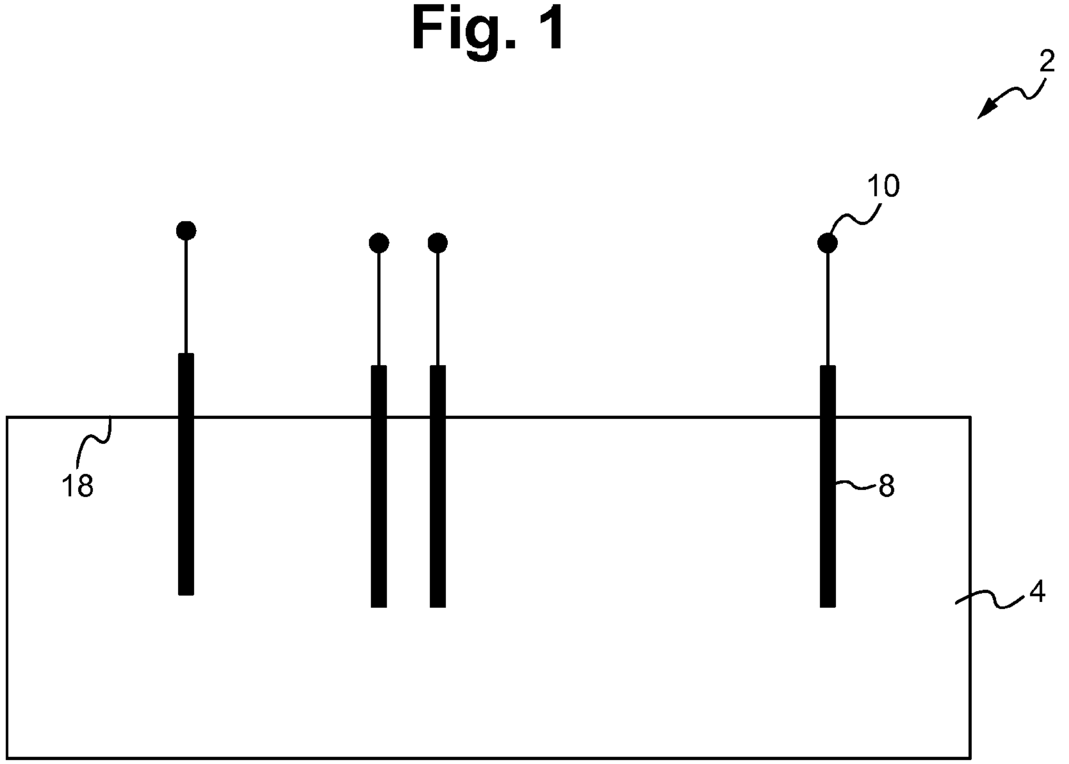
FIG. 2 illustrates a cut out side view of the ICT fixture of FIG. 1 with the top plate removed.

The top plate 6 includes a plurality of through holes 12 extending from a first surface 14 of the top plate 6 to a second surface 16 of the top plate 6. The top plate 6 is positioned on the probe plate 4 such that the surface 18 of the probe plate 4 is substantially in contact with the second surface 16 of the top plate 6. The plurality of through holes 12 are positioned in the top plate 6 such that when the top plate 6 is properly positioned on the probe plate 4, the second end of each probe 8 is positioned through a corresponding one through hole 12. The side walls of each through hole 12 are substantially perpendicular to the first surface 14 and the second surface 16 thereby forming a substantially uniform cross-section along the entire length of the through hole 12 from the first surface 14 to the second surface 16. With the top plate 6 properly positioned against the probe plate 4, the probe head 10 of each probe 8 protrudes beyond the first surface 14, thereby enabling contact of the probe head 10 against a test point of a device under test. To clean or otherwise service the probes 8, the top plate 6 can be removed, such as shown in FIG. 2.

Figure 3:
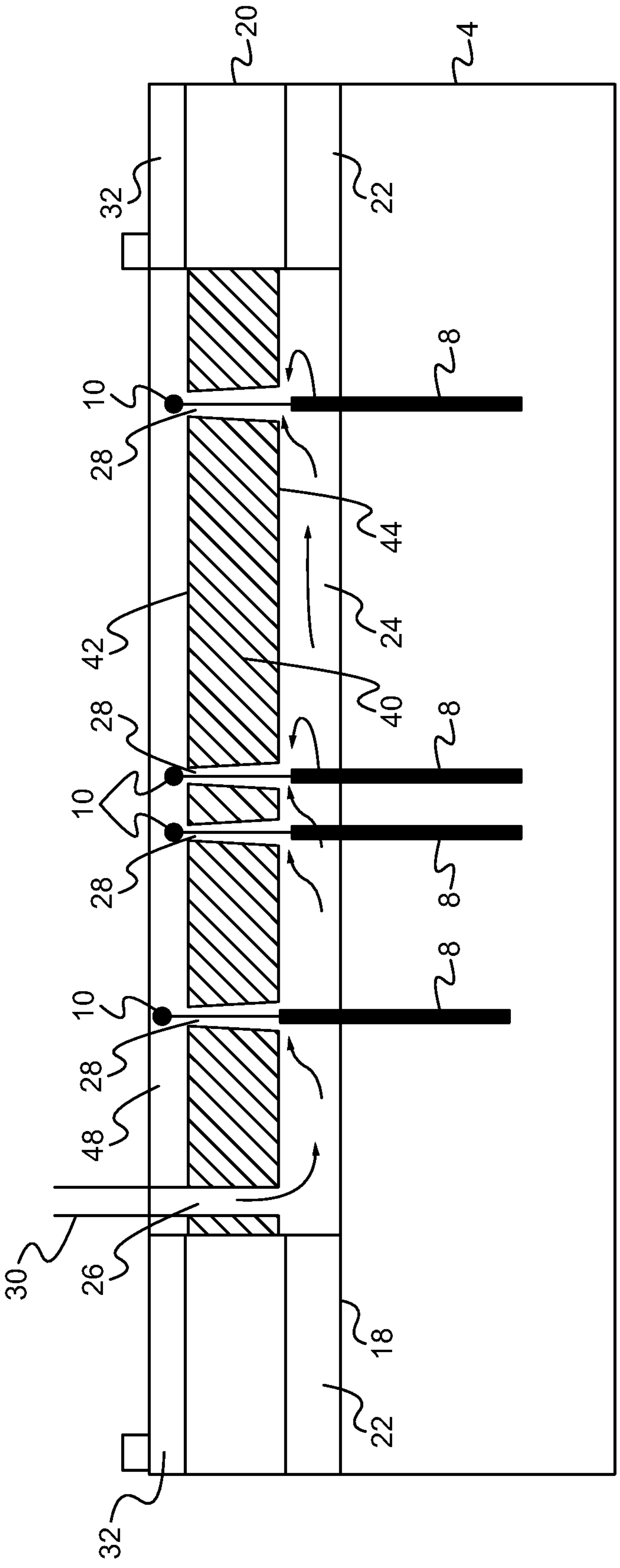
FIG. 3 illustrates a cut out side view of a probe cleaning plate positioned against the probe plate according to an embodiment.

With the top plate 6 removed, the probes 8 are exposed. Cleaning the probes 8 while in this exposed condition subjects the probes to damage. A probe cleaning plate is designed to fit onto the probe plate 4 so as to protect the probes 8 while also providing additional features for enhanced cleaning capabilities. FIG. 3 illustrates a cut out side view of a probe cleaning plate positioned against the probe plate according to an embodiment. The probe cleaning plate 20 includes a substrate 40 that has a plurality of through holes 28 extending from a first surface 42 of the substrate 40 to a second surface 44 of the substrate 40. In some embodiments, the dimensions and thickness of the substrate 40 exactly match the dimensions and thickness of the top plate 6. The substrate 40 is thermally resistant as well as being resistant to electro-static discharge. The substrate 40 is also resistant to chemicals used for cleaning the probes 8.

Figure 4:
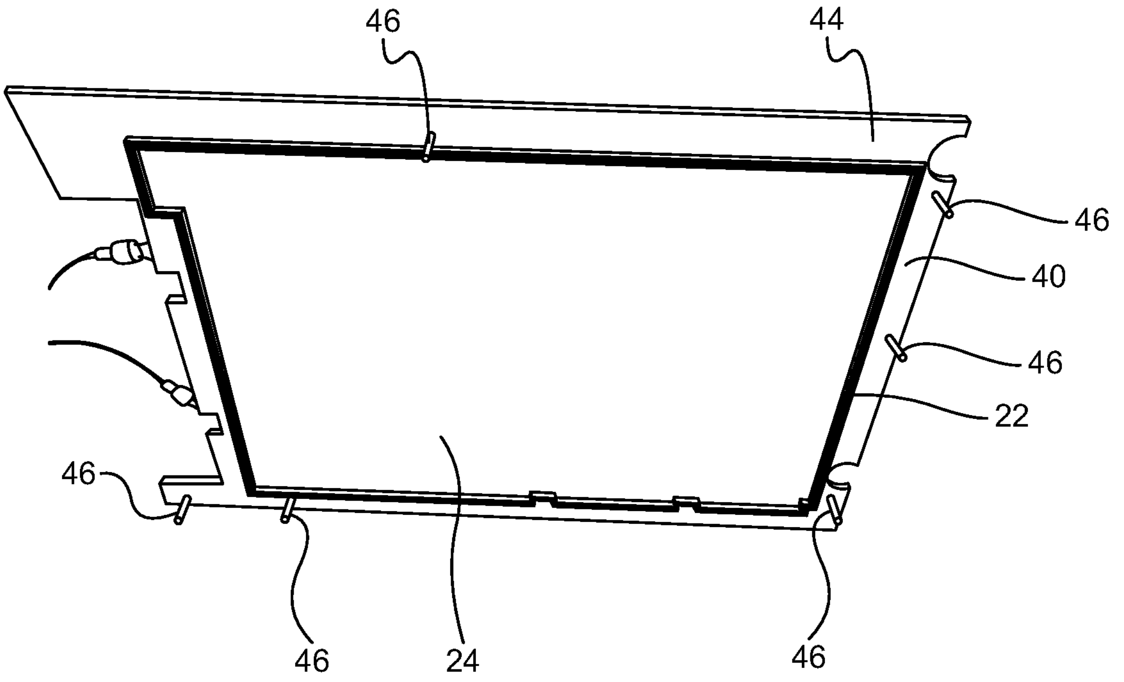
FIG. 4 illustrates a perspective bottom side view of the probe cleaning plate according to an embodiment.

The probe cleaning plate 20 also includes an air seal gasket 22 coupled to the second surface 44 of the substrate 40. In some embodiments, the air seal gasket 22 is sealed to the second surface 44 using an adhesive. It is understood that the air seal gasket 22 can be sealed to the second surface 44 of the substrate 40 using any conventional attaching means that enables an air tight seal. In some embodiments, the air seal gasket 22 forms a perimeter proximate edges of the substrate 40, such as shown in FIG. 4. FIG. 4 illustrates a perspective bottom side view of the probe cleaning plate 20. The bottom side view shows an exemplary configuration of the air seal gasket 22 attached to the second surface 44 of the substrate 40. A hollow section 24 is formed within the perimeter of the air seal gasket 22. Referring again to FIG. 3, the hollow section 24 is formed between the second surface 44 of the substrate 40 and the surface 18 of the probe plate 4 when the probe cleaning plate 20 is positioned against the probe plate 4. The probe cleaning plate 20 is positioned against the probe plate 4 such that the air seal gasket 22 is positioned against the surface 18 of the probe plate 4. In some embodiments, the probe cleaning plate 20 includes guide pins 46 (FIG. 4) protruding from the second surface 44 that align with corresponding guide holes (not shown) in the probe plate 4 at the surface 18. The guide pins prevent misalignment of the probe cleaning plate 20 to the probe plate 4. The staggered and asymmetrical positioning of the guide pins 46 also prevents improper insertions of guide pins into wrong guide pin holes. The plurality of through holes 28 are positioned in the probe cleaning plate 20 such that when the probe cleaning plate 20 is properly positioned on the probe plate 4, the second end of each probe 8 is positioned through a corresponding one through hole 28. With the probe cleaning plate 20 properly positioned against the probe plate 4, the probe head 10 of each probe 8 protrudes beyond the first surface 42 of the substrate 40, for example the probe head protrudes approximately 2 mm from the first surface 42. Exposing the probe head 10 in this manner enables the probe head 10 to be cleaned while providing stability and support to the remaining portion of the probe 8.

Figure 5:
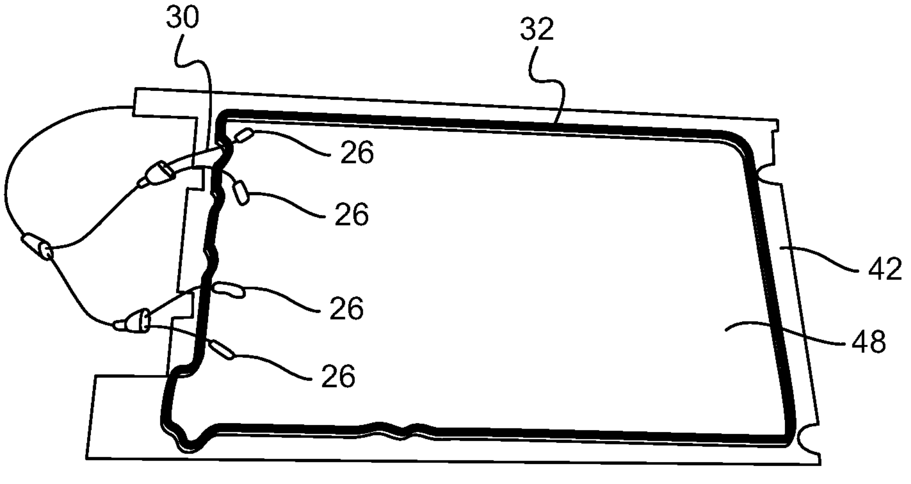
FIG. 5 illustrates a perspective top side view of the probe cleaning plate according to an embodiment.

The probe cleaning plate 20 also includes a dam 32 coupled to the first surface 42 of the substrate 40. In some embodiments, the dam 32 is sealed to the first surface 42 using an adhesive. It is understood that the dam 32 can be sealed to the first surface 42 of the substrate 40 using any conventional attaching means that enables a liquid tight seal. In some embodiments, the dam 32 forms a perimeter proximate edges of the substrate 40, such as shown in FIG. 5. FIG. 5 illustrates a perspective top side view of the probe cleaning plate 20. The top side view shows an exemplary configuration of the dam 32 attached to the first surface 42 of the substrate 40. A reservoir 48 is formed within the perimeter of the dam 32. Although the dam 32 is shown in FIG. 5 as forming a perimeter around the though holes 28 and the air input through holes 26, alternatively the dam can be formed such that the perimeter does not surround the air input through holes 26.

The probe cleaning plate 20 also includes one or more air input through holes 26 extending from the first surface 42 of the substrate 40 to the second surface 44. An air hose 30 is connected to each air input through hole 26. In the exemplary configuration shown in FIG. 5, there are four air input through holes 26 each connected to an air hose 30. It is understood that the substrate 40 can include more or less than four air input through holes. Each of the air hoses can be connected to a controlled air compressor either individually or through a commonly connected air hose. The four air input through holes 26 are shown in FIG. 5 as being positioned along a common side of the substrate. It is understood that the air input though holes can be alternatively positioned with one, some or all of the air input through holes being positioned along different sides of the substrate and/or within the interior of the substrate. In some embodiments, an air flow regulating valve is attached to each air hose 30, or to a common air hose, to control and adjust air flow.

In operation, the air compressor is turned on and air is forced through the air input through holes 26 via the air hoses 30 and into the hollow section 24. The air seal gasket 22 prevents air from laterally escaping the hollow section 24 and the air is forced out of the hollow section 24 via the through holes 28. A cleaning solution is then applied to the probe heads 10. The cleaning solution may be applied directly to the probe heads 10 or indirectly via a brush or other cleaning tool, where the brush or cleaning tool is used to scrub the probe heads 10. It is desirable to prevent or minimize cleaning solution from reaching portions of the probe 8 other than the probe head 10. Air forced outward from the through holes 28 prevents or minimizes cleaning solution from seeping into the through holes 28 and into the hollow section 24. In some embodiments, the side walls of the through holes 28 are tapered such that a cross-section of each through hole 28 proximate the first surface 42 is smaller than a cross-section proximate the second surface 44. The narrower cross-section nearer the probe head 10 minimizes a space through which cleaning solvent may enter the through hole while also concentrating the air force outputting the through hole. Once the probe heads are cleaned, the probe cleaning plate is removed and the top plate is returned.

It is understood that the probe cleaning plate is configured according to a specific probe plate. In some embodiments, the physical dimensions, locations of through holes for probes, sizes of through holes and other probe cleaning plate particulars may need to be customized. The probe cleaning system that includes the probe cleaning plate attached to the probe plate increases cleaning efficiency and effectiveness, reduces cleaning time, provides a cost effective solution and minimizes damage to probes while cleaning. The probe cleaning plate complies with electro-static discharge, thermal resistance and chemical resistance requirements. The design provides a fail proof mechanism for preventing wrong probe insertions through the use of uniquely oriented guide pins. The design provides mechanisms for preventing mechanical stress on probes and alignment issues. The design includes air leak proof seals in order to expel air only probe through holes. The design can be adapted for various specific ICT fixture configurations. The design controls cleaning solution penetration from the probe head to the probe barrel area. The design includes air flow input and output regulation.

The present application has been described in terms of specific embodiments incorporating details to facilitate the understanding of the principles of construction and operation of the method and apparatus for ICT fixture probe cleaning. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A cleaning device for cleaning a probe head of each of a plurality of probes included as part of an in-circuit testing fixture, the in-circuit testing fixture includes a probe plate wherein a first end of each of the plurality of probes is mounted to the probe plate and a second end of each of the plurality of probes protrudes away from the probe plate, the second end comprising the probe head, wherein the cleaning device comprises:

a. a substrate comprising a first surface, a second surface opposite the first surface, a plurality of first through holes extending from the first surface to the second surface and one or more air input through holes extending from the first surface to the second surface, wherein the plurality of first through holes are aligned such that each first through hole receives a second end of a corresponding one of the plurality of probes and that the probe head of each probe protrudes from the first surface of the substrate; and b. an air seal gasket coupled to the second surface of the substrate, wherein the air seal gasket forms a perimeter around the plurality of first through holes and the one or more air input through holes exposed at the second surface, wherein the cleaning device is mounted to the probe plate such that the air seal gasket is coupled to the probe plate thereby forming a hollow section between the probe plate and the second surface of the substrate and bounded by the air seal gasket such that air is directed into the hollow section via the one or more air input through holes air is directed out of the hollow section via the plurality of first through holes.

2. The cleaning device of claim 1 further comprising one or more air hoses, each air hose coupled to a corresponding one of the air input through holes.

3. The cleaning device of claim 2 further comprising an air compressor coupled to the one or more air hoses.

4. The cleaning device of claim 3 further comprising an air regulator coupled between the air compressor and the one or more air hoses.

5. The cleaning device of claim 2 wherein the one or more air hoses, the one or more air input through holes, the hollow section and the plurality of first through holes are configured to force air through the plurality of first through holes from the second surface toward the first surface.

6. The cleaning device of claim 5 wherein the air forced through the plurality of first through holes forces cleaning solvent applied to the probe heads away from the plurality of first through holes.

7. The cleaning device of claim 1 further comprising an dam coupled to the first surface of the substrate, wherein the dam forms a perimeter around the plurality of first through holes exposed at the first surface.

8. The cleaning device of claim 1 wherein the plurality of first through holes each comprise side walls, wherein the side walls taper from the second surface to the first surface such that a cross-section of each first through hole is larger at the second surface than at the first surface.

9. A cleaning device comprising:

a. a probe plate comprising a first substrate and a plurality of probes, wherein a first end of each of the plurality of probes is mounted to the first substrate and a second end of each of the plurality of probes protrudes away from the first substrate, further wherein the second end of each of the plurality of probes comprises a probe head;

a. a second substrate comprising a first surface, a second surface opposite the first surface, a plurality of first through holes extending from the first surface to the second surface and one or more air input through holes extending from the first surface to the second surface, wherein the plurality of first through holes are aligned such that each first through hole receives a second end of a corresponding one of the plurality of probes and that the probe head of each probe protrudes from the first surface of the second substrate; and b. an air seal gasket coupled to the second surface of the second substrate, wherein the air seal gasket forms a perimeter around the plurality of first through holes and the one or more air input through holes exposed at the second surface, further wherein the air seal gasket is mounted to the probe plate such that the air seal gasket is coupled to the first substrate thereby forming a hollow section between the first substrate and the second surface of the second substrate and bounded by the air seal gasket such that air is directed into the hollow section via the one or more air input through holes air is directed out of the hollow section via the plurality of first through holes.

10. The cleaning device of claim 9 further comprising one or more air hoses, each air hose coupled to a corresponding one of the air input through holes.

11. The cleaning device of claim 10 further comprising an air compressor coupled to the one or more air hoses.

12. The cleaning device of claim 11 further comprising an air regulator coupled between the air compressor and the one or more air hoses.

13. The cleaning device of claim 10 wherein the one or more air hoses, the one or more air input through holes, the hollow section and the plurality of first through holes are configured to force air through the plurality of first through holes from the second surface toward the first surface.

14. The cleaning device of claim 13 wherein the air forced through the plurality of first through holes forces cleaning solvent applied to the probe heads away from the plurality of first through holes.

15. The cleaning device of claim 9 further comprising an dam coupled to the first surface of the substrate, wherein the dam forms a perimeter around the plurality of first through holes exposed at the first surface.

16. The cleaning device of claim 9 wherein the plurality of first through holes each comprise side walls, wherein the side walls taper from the second surface to the first surface such that a cross-section of each first through hole is larger at the second surface than at the first surface.

* * * * *